(12) United States Patent
Pauchard et al.

(10) Patent No.: US 6,384,462 B1
(45) Date of Patent: May 7, 2002

(54) PLANAR HETERO-INTERFACE PHOTODETECTOR

(75) Inventors: Alexandre Pauchard, San Jose; Yu-Hwa Lo, La Jolla, both of CA (US)

(73) Assignee: Nova Crystals, Inc., San Jose, CA (US)

( * ) Notice: Subject to any disclaimer, the term of this patent is extended or adjusted under 35 U.S.C. 154(b) by 0 days.

(21) Appl. No.: 09/730,692

(22) Filed: Dec. 6, 2000

(51) Int. Cl.[7] .............................................. H01L 31/072
(52) U.S. Cl. .................... 257/461; 257/438; 257/463; 257/464
(58) Field of Search ............................. 257/438, 461, 257/463, 464

(56) References Cited

U.S. PATENT DOCUMENTS

| | | | | |
|---|---|---|---|---|
| 3,970,843 A | * | 7/1976 | Dumas | 257/626 |
| 5,229,627 A | * | 7/1993 | Kosaka | 257/184 |
| 5,434,434 A | * | 7/1995 | Kasahara | 257/432 |
| 6,074,892 A | | 6/2000 | Bowers et al. | 257/458 |
| 6,130,441 A | | 10/2000 | Bowers et al. | 257/15 |
| 6,147,391 A | | 11/2000 | Bowers et al. | 438/57 |
| 6,229,162 B1 | * | 5/2001 | Watanabe | 257/184 |

FOREIGN PATENT DOCUMENTS

JP          62031179 A   *   2/1987   .......... H01L/31/10

* cited by examiner

*Primary Examiner*—Allan R. Wilson
(74) *Attorney, Agent, or Firm*—Fish & Neave (57) ABSTRACT

A planar avalanche photodetector (APD) is fabricated by forming a, for example, InGaAs absorption layer on a $p^+$-type semiconductor substrate, such as InP, and wafer-bonding to the absorption layer a second p-type semiconductor, such as Si, to form a multiplication layer. The layer thickness of the multiplication layer is substantially identical to that of the absorption layer. A region in a top surface of the p-type Si multiplication layer is doped $n^+$-type to form a carrier separation region and a high electric field in the multiplication region. The APD can further include a guard-ring to reduce leakage currents as well as a resonant mirror structure to provide to wavelength selectivity. The planar geometry furthermore favors the integration of high-speed electronic circuits on the same substrate to fabricate monolithic optoelectronic transceivers.

13 Claims, 6 Drawing Sheets

PLANAR HETERO-INTERFACE PHOTODETECTOR

FIELD OF THE INVENTION

This invention is directed to an avalanche photodiode useful in high-speed optical fiber applications. More particularly, the invention is related to a planar hetero-interface avalanche photodiode fabricated by wafer bonding and having a high and controllable electric field in both the absorption and multiplication regions.

BACKGROUND OF THE INVENTION

Ever increasing demand for higher-throughput telecommunication and data-transmission are more than met by the immense information carrying capacities of optical fibers. The deployment of optical fiber transmission systems and their emerging penetration into local area networks has increased the need for high performance (low noise, high speed) and cost effective interfaces between the optical fiber and electronics. A data rate in excess of 40 Gb/s per channel is presently an important goal for the component industry.

Due to their optical absorption characteristics, InGaAs/InP p-i-n and avalanche photodiodes have formed the basis for photodetectors in optical communication systems operating in both the 1.3 $\mu$m and 1.55 $\mu$m transmission windows. Avalanche photodiodes (APD) having separate absorption and multiplication regions offer higher sensitivity detection in long wavelength optical communication receivers as compared to conventional p-i-n diodes because of the internal gain provided by impact ionization and carrier multiplication. Fiber optic receivers exploit the internal multiplication gain of avalanche photodiodes to achieve substantial improvement in sensitivity as compared to p-i-n photodiode-based receivers. However, the gain-bandwidth product of InP-based avalanche photodiodes is limited because the electron ionization coefficient is nearly identical to the hole ionization coefficient.

The ternary semiconductor $In_{0.53}Ga_{0.47}As$, lattice matched to InP, is the preferred material for integrated fiber-optic telecommunications receivers. The high absorption of light in the wavelength range between 1.3 $\mu$m and 1.5 $\mu$m, the high carrier mobility and saturation velocities make InGaAs the material of choice for efficient, high-speed photodiodes. Most of today's APDs use InGaAs as material for the absorption region and InP as material for the multiplication region. However, since the electron and hole ionization rates in InP are substantially identical, low-noise and high-speed operation is difficult to achieve. APDs made of InGaAs/InP of many different designs have been reported, including monolithically integrated optoelectronic circuits.

Silicon, on the other hand, has dissimilar electron and hole ionization rates and hence is the material of choice for low-noise and high-speed operation, for example, for high-performance reach-through APDs. Unfortunately, silicon does not absorb light in the optical regions used for optical telecommunications. High-performance InGaAs/Si composite APDs are difficult to fabricate since high-quality InGaAs cannot be grown directly on silicon due to a large mismatch of about 8% in the respective lattice constants.

Wafer fusion has recently been shown to overcome some of the intrinsic limitations of APDs based on InGaAs/InP and directly grown InGaAs/Si heterostructures. The use of silicon as a multiplication region and III-V compounds as an absorption region creates highly-efficient photodetectors with potentially high gain-bandwidth products and low-noise.

Prior art hetero-interface APDs were built on Si substrates and have a mesa-type structure to limit the active area and avoid a premature avalanche breakdown in the edge regions of the photodiode. Mesa-type structures produced on Si substrates, however, have several drawbacks: they require a more complex fabrication process and have a higher dark current due leakage along the sidewalls; and stress within the relatively thin III-V layers fused to silicon substrates tends to induce defects in the III-V layers. Moreover, since the substrate of conventional APDs tends to be doped lower, than the multiplication region, the electric field extends in a direction opposite to the absorption layer. The geometry of conventional APDs is therefore not suitable for controllably producing a high electric field within the absorption region.

A semiconductor hetero-interface APD using wafer fusion is disclosed, for example, in U.S. Pat. No. 6,074,892, which describes avalanche photodetectors constructed by two different methods, one using a single fusion step and another using two separate fusion steps. In the single fusion method, an $In_{0.53}Ga_{0.47}As/InP$ wafer was fused to an epitaxial silicon layer grown on a silicon substrate having a shallow p-type ion implant at its surface. After the fusion step the InP substrate was removed.

In the two step fusion method, first an intrinsic $In_{0.53}Ga_{0.47}As$ layer on an InP substrate was fused to an intrinsic epitaxial Si layer grown on an n$^+$substrate with a shallow p-type ion implant at its surface. After the first fusion step, the InP substrate was selectively removed leaving only the InGaAs epitaxial layer. A second p$^+$doped $In_{0.53}Ga_{0.47}As$ layer on an InP substrate was then fused to the first InGaAs layer and the InP substrate subsequently removed. In both fusion methods, the Si surface was implanted with a 10 keV, 1.3×10$^{12}$ cm$^{-2}$ dose of boron atoms, resulting in a shallow p-type layer with a thickness of a few tens of nanometers.

For an avalanche photodiode to achieve high frequencies, the electric field in the absorption layer must be carefully controlled: it should be high enough to achieve a high carrier velocity, but smaller than about 100 kV/cm to avoid tunneling in the InGaAs region.

To fulfill this condition, four parameters of the prior art APD had to be optimized: the thickness and doping concentration of the epitaxial i-InGaAs layer, and thickness and doping concentration of the implanted p$^+$Si layer. The thickness and doping concentration of the epitaxial i-InGaAs layer can be suitable controlled by selecting the epitaxial growth parameters. On the other hand, the thickness and doping concentration of the implanted p$^+$Si layer, which are more critical, are also more difficult to control: if the doping concentration of the p$^+$layer is too high, then the electric field will not be able to penetrate in the absorption region, thus reducing the photodiode bandwidth. If the p$^+$layer is too thick, then a high bias voltage is needed to entirely deplete the p$^+$layer. The required high bias voltage can be significantly higher than the voltage at which breakdown occurs. This structure is therefore very sensitive to process variations because of the stringent requirements on the shallow implanted p$^+$silicon layer.

It would therefore be desirable to produce an APD that has a wider processing latitude, is easier to manufacture, while still providing a high electric field in the multiplication and absorption regions that is less than the breakdown field.

Indium phosphide (InP) transistors are superior in terms of current density, breakdown voltage, and electron velocity to silicon transistors. It would therefore also be desirable to monolithically integrate high speed low-noise transistors with optoelectronic circuits to achieve high data rates.

SUMMARY OF THE INVENTION

The invention is directed to a planar avalanche photodetector (APD) fabricated by wafer-bonding. According to one aspect of the invention, an absorption layer of a second conductivity type with a doping concentration substantially less than a doping concentration of the first semiconductor is applied on a first semiconductor. A second semiconductor of the first conductivity type is wafer-bonded to a surface of the absorption layer opposite to the first semiconductor to form a multiplication layer. A region of the second conductivity type is then formed on a surface of the second semiconductor opposite to the wafer-bonded absorption layer to provide an electrical contact. According to another aspect of the invention, a semiconductor device includes a first semiconductor of a first conductivity type, an absorption layer of a second conductivity type which is disposed on the first semiconductor and has a doping concentration substantially less than a doping concentration of the first semiconductor, and a second semiconductor of the first conductivity type wafer-bonded to a surface of the absorption layer opposite to the first semiconductor and forming a multiplication layer. The multiplication layer has a layer thickness that is significantly less than a thickness of the first semiconductor and a doping concentration that is greater than the doping concentration of the absorption layer. A region of the second conductivity type is formed on the second semiconductor, wherein the region has a doping concentration that is substantially greater than a doping concentration of the second semiconductor.

The above arrangement of the layers constituting the APD achieves a controllable high electric field in both the absorption and multiplication regions. To this aim, the doping concentration of the multiplication layer adjacent to the absorption layer is set at a lower level than that of the first semiconductor, while having the same conductivity type.

Embodiments of the invention may have one or several of the following features. The first semiconductor can be InP or InGaAs, with the absorption layer being made of InGaAs. However, other III-V materials, such as (AlGaIn)N, (AlGa)As, etc., may also be used. The second semiconductor can be silicon, germanium or another material suitable for providing avalanche gain. The first semiconductor can have a doping level of between $10^{18}$ cm$^{-3}$ and $10^{21}$ cm$^{-3}$. The first conductivity type can be p-type (n-type) and the second conductivity type can be one of intrinsic or n-type (p-type). The thickness of the multiplication region can substantially identical to the thickness of the absorption region to provide an optimum performance. The respective thickness of the absorption and multiplication region is selected to be between 0.1 $\mu$m and 10 $\mu$m, preferably between 0.5 $\mu$m and 2 $\mu$m. The second semiconductor that is wafer-bonded can either have a reduced thickness or can be thinned down to the desired thickness after wafer-bonding. The region of the second conductivity type formed in the second semiconductor can at least partially laterally surrounded by a guard ring. A second semiconductor device can be integrated with the APD on the first semiconductor to produce an integrated optical transceiver.

Further features and advantages of the present invention will be apparent from the following description of preferred embodiments and from the claims.

BRIEF DESCRIPTION OF THE DRAWINGS

The following figures depict certain illustrative embodiments of the invention in which rare like reference numerals refer to like elements. These depicted embodiments are to be understood as illustrative of the invention and not as limiting in any way.

DETAILED DESCRIPTION OF CERTAIN ILLUSTRATED EMBODIMENTS

The invention is directed to a planar photodetector that can be fabricated by a wafer bonding be technique with a small number of processing steps. In particular, the planar photodetector described herein eliminates etching of mesas, while having a low leakage current and high speed.

Figure 1:
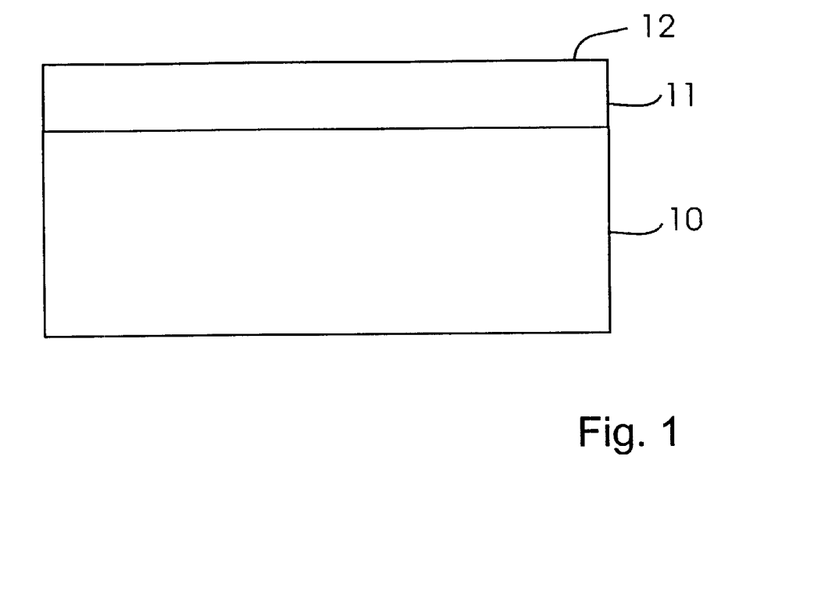
FIG. 1 shows schematically an epitaxial wafer.

Referring now to FIGS. 1–4, an absorption layer 11 made of, for example, unintentionally doped n-type InGaAs is grown on a substrate 10, such as p-type InP (FIG. 1). The absorption layer 11 can have a thickness of approximately 1 $\mu$m and a doping concentration in the order of $10^{15}$ cm$^{-3}$. The substrate 10 is typically heavily doped to >$10^{18}$ cm$^{-3}$.

Figure 2:
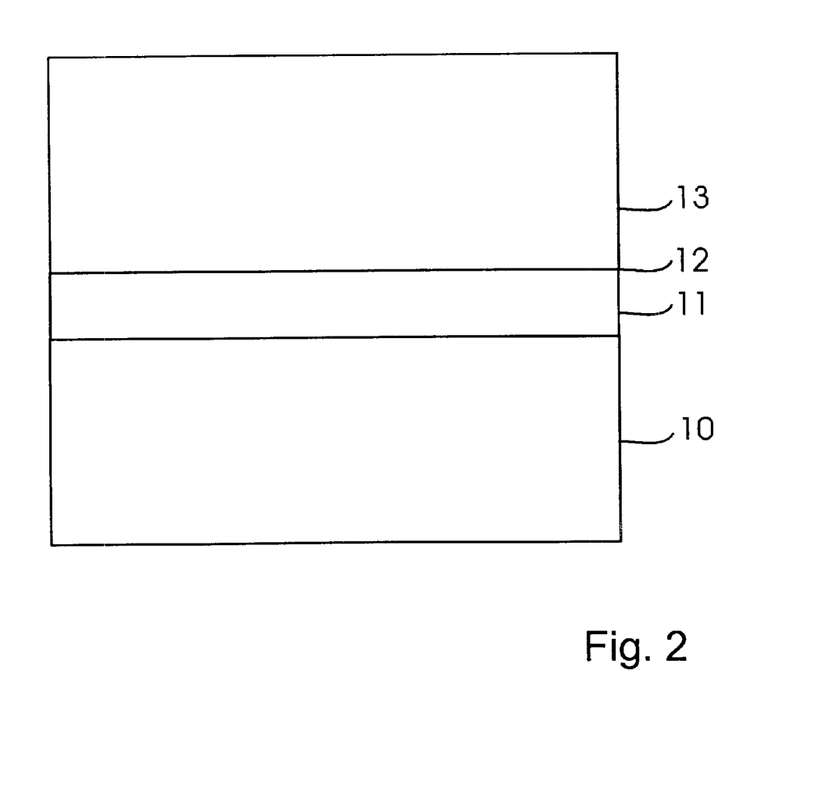
FIG. 2 shows schematically a silicon wafer bonded to the epitaxial wafer.
Figure 3:
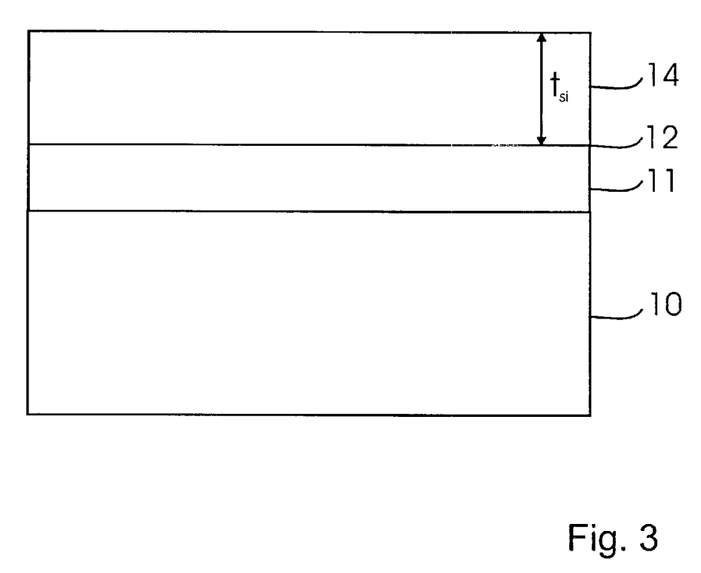
FIG. 3 shows schematically the silicon/epitaxial wafer of FIG. 2 after thinning of the silicon.

As seen in FIG. 2, a top surface 12 of the absorption layer 11 is then wafer-bonded (fused) to a silicon wafer 13 in a manner known in the art. The silicon wafer 13 can be p-type and have a doping concentration of, for example, $10^{16}$–$10^{17}$ cm$^{-3}$, and can optionally be thinned prior to the fusion process. Wafer bonding per se is not the subject matter of the present invention. Following wafer bonding, the silicon wafer 13 can be thinned, for example, by etching, to form a layer 14 having a thickness $t_{si}$ of, for example, between one and several microns, as depicted in FIG. 3. Different methods can be implemented to control $t_{si}$. For example, the substrate of a silicon-on-insulator (SOI) wafer can be lapped or etched prior to selectively etching the insulator layer, leaving a thin crystalline silicon layer of high quality. Alternatively, a bulk silicon crystal can be mechanically thinned to a given thickness and covered with a protective layer. A window can then be opened in the thinned Si layer, whereafter the Si layer is selectively etched down to the III-V compound interface. The protection layer can then be removed, the thickness of the silicon measured, and the silicon layer etched further, while repeating the last two steps until the desired silicon thickness is achieved.

Figure 4:
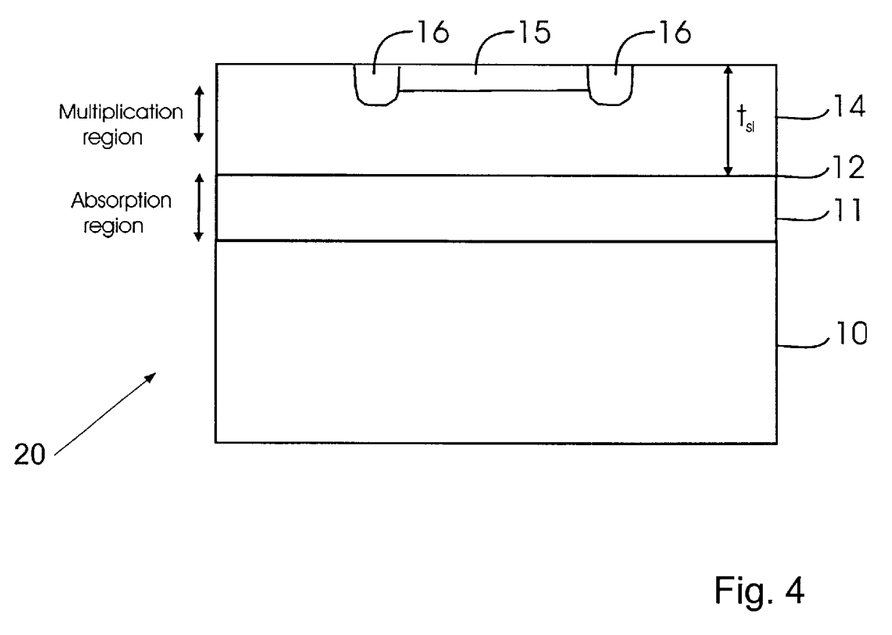
FIG. 4 shows schematically the silicon/epitaxial wafer of FIG. 3 with a contact layer and a guard-ring.

As seen in FIG. 4, an n$^+$-type layer 15 is formed in the p-type silicon layer 14 by ion implantation or a diffusion step. The n$^+$-type layer 15 in conjunction with the p-type silicon layer 14 produces a p-n junction for carrier separation. An n-type guard-ring 16 is placed around the n$^+$-type layer 15 to avoid premature edge breakdown at low reverse bias. The depletion region An formed at the silicon p-n junction will act as the multiplication region of the APD.

In a final conventional processing step, metal is deposited over the n$^+$-type layer 15 to contact the device and the surface is passivated. The device can be illuminated from the front or back of depending on details of the contact configuration.

The device structure of the present invention advantageously reduces defects and other stress-related problems. By fabricating the disclosed structure by thinning the silicon substrate rather than by etching the InP substrate, both the normal and shear stress are minimized, since silicon is harder than InP, thereby increasing the device yield.

Figure 5:
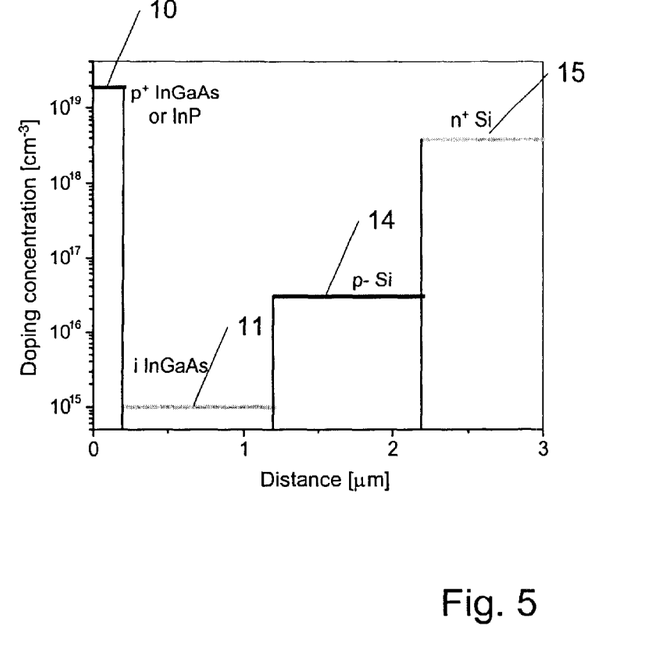
FIG. 5 shows the doping concentration of the structure of FIG. 4.
Figure 6:
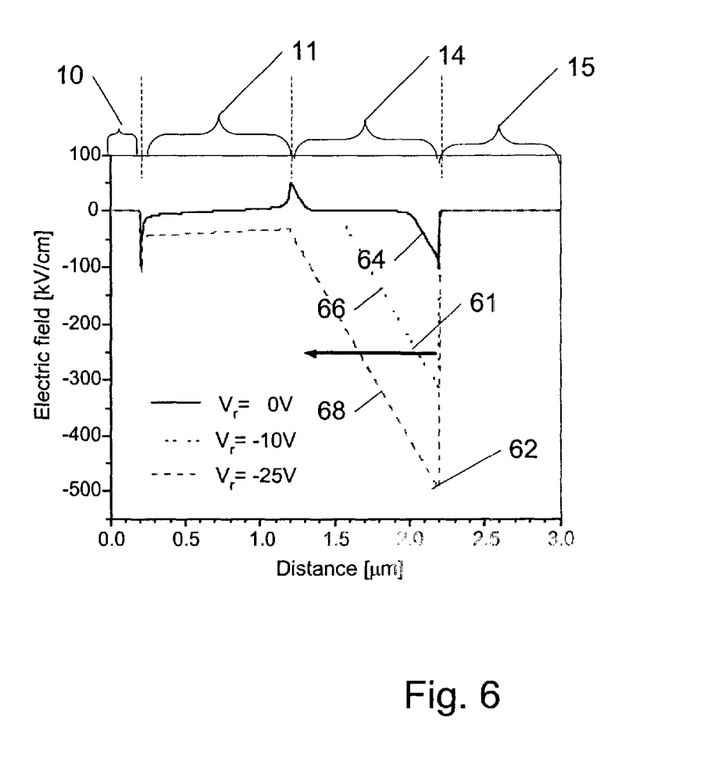
FIG. 6 shows the electric field in the structure of FIG. 4 at a reverse bias of 0V, −10V and −25V.

FIGS. 5 and 6 illustrate the doping concentration discussed above and the electric field distribution, respectively, for the device of FIG. 4. The p-type Si multiplication layer 14 adjacent to the absorption layer 11 is designed to have a lower doping concentration than the n$^+$-type silicon region 15. As seen from FIG. 6, the electric field maximum 62 is located at the interface between the n$^+$-type layer 15 and the p-type silicon layer 14. An increase in the reverse bias voltage $V_r$ increases the electric field in the multiplication region (the p-type silicon layer 14) and simultaneously moves the electric field towards the absorption region (the InGaAs absorption layer 11), as indicated by arrow 61. The curves 64, 66, and 68 represent the electric field distribution for a reverse bias of $V_r$=0 Volt, −10 Volt, and −25 Volt, respectively. When the reverse bias $V_r$ reaches a certain value depending on the specific layer thickness and doping concentration in the respective layers 11, 14, the electric field penetrates in the InGaAs absorption layer 11. As indicated by curve 68, a reverse bias of $V_r$=−25 Volt produces a field of approximately 50 kV/cm in the absorption region 11. A further increase in the reverse bias voltage $V_r$ increases the electric field in both the absorption region and the multiplication region. The electric field within the InGaAs absorption region 11 must be high enough for the carriers to reach the saturation velocity, but must be kept below about 150 kV/cm to avoid a high leakage current due to tunneling within the absorption region. The doping concentration and thickness of the silicon layer 14 can be optimized to achieve a high electric field within the silicon layer 14 to allow optimal avalanche multiplication.

It should also be noted that with the device structure of the invention, only two parameters determine the electric field strength in the absorption region: the thickness of the multiplication layer 14 and the doping concentration of the multiplication layer 14. Both parameters are not critical and can be controlled using conventional epitaxial growth techniques, such as chemical vapor deposition (CVD) and molecular beam epitaxy (MBE).

The process for fabricating the planar hetero-interface APD of the invention is remarkably simple, requiring only three mask levels: one mask for the contact layer, one mask for the guard ring and one mask for the metal contacts. This contrasts with the fabrication of mesa-type APDs, which requires six or more mask levels: one for the contact to the MESA, one for the etching protection, two for the polyamide passivations and two for the metal contacts. The planar structure also eliminates critical mesa etching, passivation and contact metallization steps.

Conventional APDs produced on a Si substrate require the fabrication of a p$^+$doped InGaAs contact layer for contacting the InGaAs absorption layer. A doping grading layer has to be placed between the p$^+$contact layer and the absorption layer to reduce zinc diffusion into the absorption layer during growth and subsequent wafer fusion. In contrast, the contact for the present device is not applied to the absorption layer 11, but to the backside of the InP substrate. This obviates the need for a doping grading layer and eliminates problems associated with dopant diffusion into the absorption layer.

A planar APD structure prevents problems associated with leakage currents along the sidewalls of mesa structures. The better surface passivation of planar APDs compared to mesa-type devices enables the fabrication of photodiodes having a much lower dark current, which is important for achieving a high signal-to-noise ratio and a low receiver offset voltage.

Figure 7:
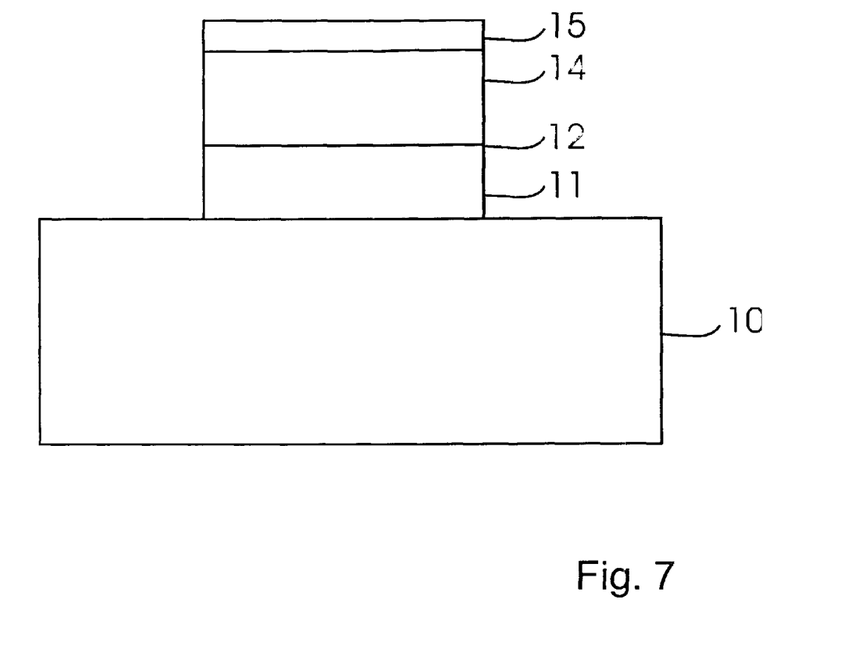
FIG. 7 shows schematically a mesa structure.

Ultra-high frequency operation may still require multiplication and absorption regions with a well defined active area. In this case, a mesa structure may still be advantageous; such structure can be fabricated by etching the silicon layers 14 and 15, and the InGaAs layer 11 down to the III-V substrate 10, as shown in FIG. 7. However, the advantages of the device structure of the invention described above with reference to FIGS. 1 to 6 remain.

The planar APD structure of the invention preferably also includes a guard ring to avoid a premature and detrimental avalanche breakdown at the photodiode edges and therefore to guarantee a good multiplication gain uniformity. In one embodiment depicted in FIG. 4, the guard ring includes a ring 16 surrounding the n$^+$-Si layer region 15 and having the same doping type as, but a lower doping concentration than the highly-doped n$^+$-Si layer region 15.

Figure 8:
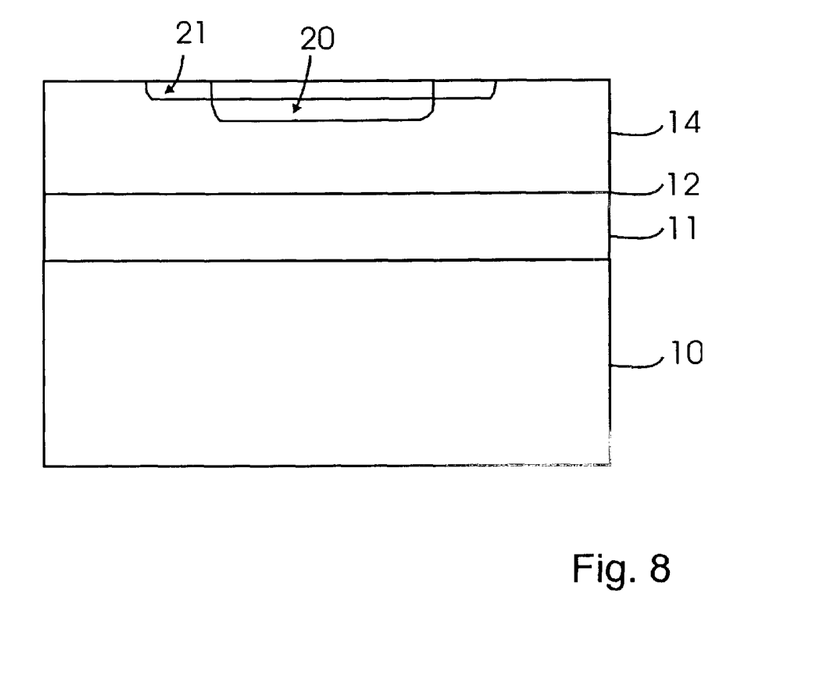
FIG. 8 shows one embodiment of the guard-ring.

In an alternative embodiment of a guard ring illustrated in FIG. 8, the guard ring is formed by forming a layer 20 having the same dopant type, but a larger doping concentration than the layer 14, i.e., in the exemplary structure both layers 20 and 14 are p-type Si. A second layer 21 which is thinner than the layer 20 and has the opposite doping type of layers 20 and 14, is subsequently formed, e.g., by ion implantation or diffusion, as known in the art.

Figure 9:
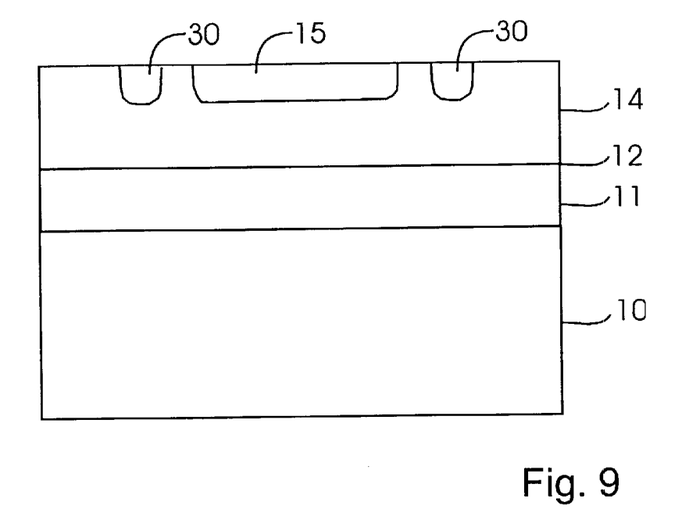
FIG. 9 shows an alternative embodiment of the guard-ring.

FIG. 9 depicts a third embodiment of a guard ring in form of a floating guard ring 30. The floating guard ring 30 is placed at a given distance from layer 15 and has the same doping type as layer 15. Advantageously, a floating guard ring structure minimizes the number of photolithographic mask levels.

Figure 10:
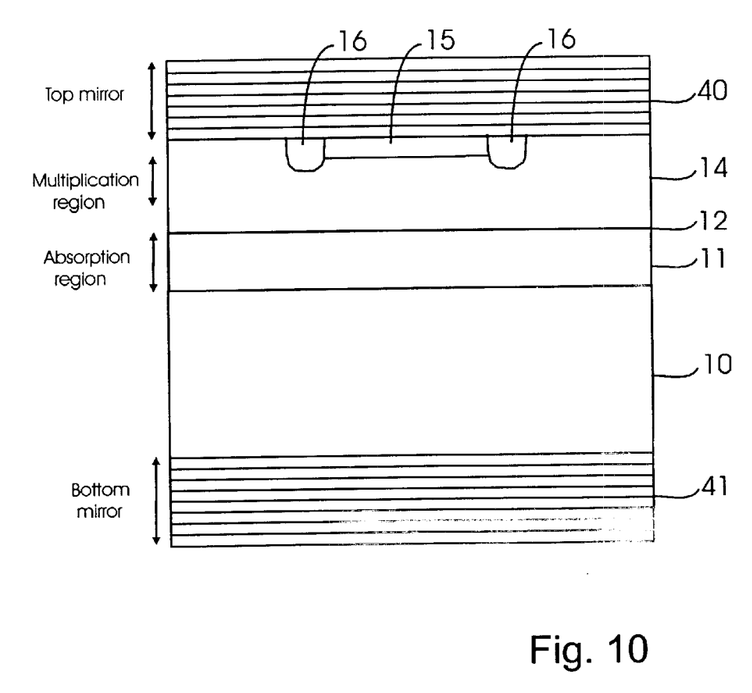
FIG. 10 shows schematically the structure of FIG. 4 with additional top and bottom mirrors.

FIG. 10 depicts a resonant-cavity APD that advantageously increases the gain-quantum efficiency. The basic APD structure is identical to the device 20 of FIG. 4. A top mirror 40 and a 4) bottom mirror 41 are placed on respective top and bottom surfaces of the device 20. Light that passes through the absorption region 11 without being completely absorbed is reflected by one of the mirrors 40, 41 and has a chance to be absorbed in a subsequent pass. The advantages outlined above for APDs also apply to resonant-cavity APDs.

Figure 11:
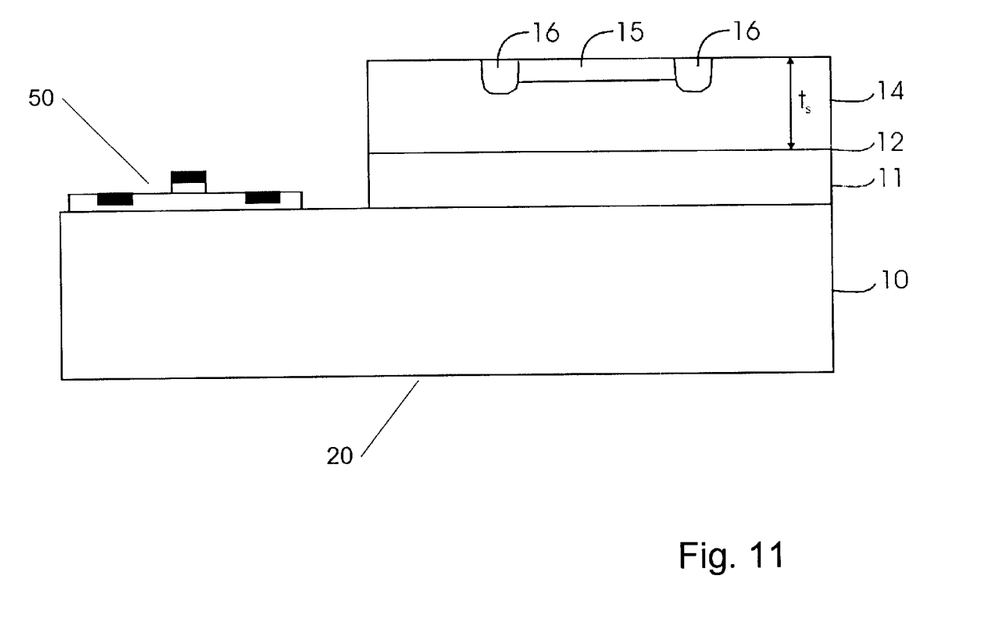
FIG. 11 shows schematically the structure of FIG. 4 with an additional junction field-effect transistor to form a monolithic optical receiver.

FIG. 11 depicts an embodiment of a monolithically integrated transimpedance photoreceiver, combining the APD of FIG. 4 with a junction field-effect transistor (JFET) 50. The exemplary JFET can be implemented in the same InGaAs layer 11 which operates as the absorption layer 11 of the APD 20 grown lattice-matched on InP by conventional techniques that include etching and ion implantation to provide substrate isolation and define a conductive channel. The JFET implemented in InGaAs has a higher speed. If the APD were fabricated on a Si substrate, a comparable integration with a Si JFET would have a considerably lower speed performance.

While the invention has been disclosed in connection with the preferred embodiments shown and described in detail, various modifications and improvements thereon will become readily apparent to those skilled in the art. Although the APD is described as being fabricated from InP, InGaAs and Si, similar devices can also be fabricated from other III-V compound materials, such as GaAs, GaP, GaN and the like, of from II-VI materials, such as ZnSe, CdTe and the like, depending on the desired application and wavelength range. Likewise, the material of the multiplication region is not limited to Si, but can also be Ge, or a III-V and/or II-VI compound semiconductor known in the art. Instead of the exemplary JFET, a heterojunction bipolar transistor (HBT) could be employed. Accordingly, the spirit and scope of the present invention is to be limited only by the following claims.

What is claimed is:

1. A semiconductor device comprising:

a first semiconductor of a first conductivity type, an absorption layer of a second conductivity type disposed on the first semiconductor and having a doping concentration substantially less than a doping concentration of the first semiconductor, a second semiconductor of the first conductivity type wafer-bonded to a surface of the absorption layer opposite to the first semiconductor and forming a multiplication layer, with the second semiconductor having a layer thickness that is significantly less than a thickness of the first semiconductor and a doping concentration that is greater than the doping concentration of the absorption layer, and a region of the second conductivity type formed on the second semiconductor, wherein the region has a doping concentration that is substantially greater than a doping concentration of the second semiconductor.

2. The semiconductor device of claim 1, wherein the first semiconductor comprises InP or InGaAs and the absorption layer comprises InGaAs.

3. The semiconductor device of claim 1, wherein the second semiconductor is silicon.

4. The semiconductor device of claim 1, wherein the first conductivity type is p-type and the second conductivity type is one of intrinsic or n-type.

5. The semiconductor device of claim 1, wherein the thickness of the multiplication region is substantially identical to the thickness of the absorption region.

6. The semiconductor device of claim 1, wherein the thickness of the multiplication region is between 0.1 $\mu$m and 10 $\mu$m.

7. The semiconductor device of claim 6, wherein the thickness of the multiplication region is between 0.5 $\mu$m and 2 $\mu$m.

8. The semiconductor device of claim 1, wherein the region of the second conductivity type formed in the second semiconductor is at least partially laterally surrounded by a guard ring.

9. The semiconductor device of claim 1, further including a second electronic device disposed on the first substrate and remote from the second semiconductor.

10. The semiconductor device of claim 9, wherein the second electronic device is a field-effect transistor.

11. The semiconductor device of claim 1, wherein the semiconductor device is an avalanche photodiode (APD).

12. A planar photodetector device comprising:

a semiconductor substrate comprising a compound semiconductor selected from one of InP and InGaAs and having a first conductivity type, an absorption layer disposed on the semiconductor substrate and made of InGaAs, the absorption layer having a doping concentration of a second conductivity type substantially less than a doping concentration of the first semiconductor, a multiplication layer comprising a group IV semiconductor and being of the first conductivity type with a doping concentration that is greater than the doping concentration of the absorption layer, wherein the multiplication layer is wafer-bonded to a surface of the absorption layer opposite to the semiconductor substrate and has a thickness substantially identical to the thickness of the absorption layer, a contact region of the second conductivity type formed on the multiplication layer and having a doping concentration that is substantially greater than a doping concentration of the multiplication layer, and a guard ring substantially encircling the contact region.

13. The semiconductor device of claim 12, wherein the first conductivity type is p-type and the second conductivity type is one of intrinsic or n-type.

* * * * *